(12) United States Patent
Kim et al.

(10) Patent No.: US 8,021,901 B2
(45) Date of Patent: Sep. 20, 2011

(54) METHOD OF FABRICATING VERTICAL STRUCTURE NITRIDE SEMICONDUCTOR LIGHT EMITTING DEVICE

(75) Inventors: Dong Woo Kim, Choongchungbook-do (KR); Yong Chun Kim, Kyungki-do (KR); Bok Ki Min, Kyungki-do (KR)

(73) Assignee: Samsung LED Co., Ltd., Gyungggi-do (KR)

( * ) Notice: Subject to any disclaimer, the term of this patent is extended or adjusted under 35 U.S.C. 154(b) by 819 days.

(21) Appl. No.: 11/714,192

(22) Filed: Mar. 6, 2007

(65) Prior Publication Data

US 2007/0155032 A1 Jul. 5, 2007

Related U.S. Application Data

(62) Division of application No. 11/311,169, filed on Dec. 20, 2005, now abandoned.

(30) Foreign Application Priority Data

Apr. 15, 2005 (KR) .............................. 10-2005-31613

(51) Int. Cl.
*H01L 21/00* (2006.01)
(52) U.S. Cl. .................................. 438/22; 257/E25.028
(58) Field of Classification Search ........... 257/E25.028, 257/E25.08; 438/22
See application file for complete search history.

(56) References Cited

U.S. PATENT DOCUMENTS

| 5,087,949 A * | 2/1992 | Haitz ............................... 257/79 |
| 5,181,219 A * | 1/1993 | Mori et al. .................. 372/45.01 |
| 6,420,242 B1 | 7/2002 | Cheung et al. |
| 2002/0017651 A1 | 2/2002 | Kato et al. |
| 2002/0063258 A1 | 5/2002 | Motoki |
| 2002/0185648 A1 | 12/2002 | Furukawa et al. |
| 2003/0189215 A1 * | 10/2003 | Lee et al. ........................ 257/94 |
| 2004/0008747 A1 * | 1/2004 | Nakayama et al. ............. 372/46 |
| 2004/0235210 A1 | 11/2004 | Tamura et al. |
| 2005/0017253 A1 | 1/2005 | Hata |

(Continued)

FOREIGN PATENT DOCUMENTS

JP 07-030209 1/1995

(Continued)

OTHER PUBLICATIONS

US Office Action, issued in U.S. Appl. No. 11/311,169, dated on Oct. 16, 2007.

(Continued)

*Primary Examiner* — Matthew Reames
(74) *Attorney, Agent, or Firm* — McDermott Will & Emery LLP

(57) ABSTRACT

A method of fabricating a vertical structure nitride semiconductor light emitting device having a cross-sectional shape of a polygon having five or more sides or a circle. A light emitting structure is formed on a sapphire substrate. A metal layer having a plurality of patterns is formed on the light emitting structure. The patterns of the metal layer each have a shape corresponding to a cross-sectional shape of a wanted final light emitting device and are spaced apart by a predetermined distance such that an upper surface of the light emitting structure is partially exposed. The light emitting structure is divided into a plurality of individualized light emitting structures by removing the light emitting structure below the exposed region between the patterns of the metal layer. The sapphire substrate is separated from the light emitting structure by irradiating a laser beam.

9 Claims, 7 Drawing Sheets

U.S. PATENT DOCUMENTS

| | | |
|---|---|---|
| 2005/0042845 A1 | 2/2005 | Urbanek |
| 2005/0227455 A1 | 10/2005 | Park et al. |

FOREIGN PATENT DOCUMENTS

| | | |
|---|---|---|
| JP | 11-340576 | 12/1999 |
| JP | 2001-085736 | 3/2001 |
| JP | 2001-244503 | 9/2001 |
| JP | 2001-358364 | 12/2001 |
| JP | 2002-043633 | 2/2002 |
| JP | 2002-198569 | 7/2002 |
| JP | 2004-095959 | 3/2004 |
| JP | 2004-173826 | 6/2004 |
| JP | 2005-012188 | 1/2005 |
| JP | 2005-064475 | 3/2005 |
| KR | 10-2005-12729 A | 2/2005 |
| WO | WO 03/088318 A2 | 10/2003 |
| WO | WO 2004/032247 A2 | 4/2004 |

OTHER PUBLICATIONS

United States Office Action issued in U.S. Appl. No. US 11/311,169, mailed May 2, 2007.

Japanese Office Action issued in Japanese Patent Application No. JP 2005-372793, dated Sep. 29, 2009.

Japanese Decision of Rejection, w/ English translation thereof, issued in Japanese Patent Application No. JP 2005-372793 dated Aug. 31, 2010.

* cited by examiner (a)

(b)

(a)

Laser beam irradiation (b)

METHOD OF FABRICATING VERTICAL STRUCTURE NITRIDE SEMICONDUCTOR LIGHT EMITTING DEVICE

RELATED APPLICATION

This application is a divisional of U.S. Ser. No. 11/311,169, filed on Dec. 20, 2005 now abandoned, which in turn claims the benefit of Korean Application No. 10-2005-0031613, filed on Apr. 15, 2005, the disclosures of which Applications are incorporated by reference herein.

BACKGROUND OF THE INVENTION

1. Field of the Invention

The present invention relates to a method of fabricating a vertical structure nitride semiconductor light emitting device, and more particularly, to a method of fabricating a vertical structure nitride semiconductor light emitting device that can allow the vertical structure nitride semiconductor light emitting device to be fabricated with a polygonal cross section having five or more sides such that the amount of light emitting from a side surface of the light emitting device is increased to improve the light extraction efficiency and to decrease the heat generation due to an total internal reflection.

2. Description of the Related Art

In general, a nitride semiconductor, which is a III-V semiconductor crystal, such as GaN, InN, AlN or the like, is widely used in a light emitting device (LED) that can emit a single wavelength of light, especially, blue light.

Since a nitride semiconductor light emitting device in particular is fabricated using a sapphire substrate or the like satisfying a lattice matching condition for a crystal growth, it has a horizontal structure in which two electrodes connected with p-type and n-type nitride semiconductor layers are arranged nearly in parallel with an upper surface of a light emitting structure. A horizontal structure nitride semiconductor light emitting device (LED) according to the related art is shown in FIG. 1A.

Referring to FIG. 1A, the horizontal structure nitride semiconductor LED according to the related art is configured to include a sapphire substrate 11, an n-type nitride semiconductor layer 12, an active layer 13, a p-type nitride semiconductor layer 14 and an ohmic contact layer 15 sequentially deposited on the sapphire substrate, an n-side electrode 16 disposed on a partially exposed upper surface of the n-type nitride semiconductor layer 12, and a p-side electrode disposed on an upper surface of the ohmic contact layer 15.

However, the horizontal structure nitride semiconductor LED has several drawbacks as follows.

First, a flow of current toward the p-side electrode 17 from the n-side electrode 16 via the active layer 13 is formed narrow in a horizontal direction. Such a narrow current flow causes the forward bias (Vf) of the horizontal structure nitride semiconductor LED to increase, so that the current efficiency is deteriorated.

Also, in the horizontal structure nitride semiconductor LED, since an increase in the current density increases the amount of heat generation and a low thermal conductivity of the sapphire substrate suppresses a smooth heat radiation, a mechanical stress may occur between the sapphire substrate and the nitride semiconductor light emitting structure due to the increase of heat generation, so that the device become instable.

Additionally, in order to form the n-side electrode 16 in the horizontal structure nitride semiconductor LED, it is required that the partial upper surface of the n-type nitride semiconductor layer 12 be exposed by partially removing the active layer 13 and the p-type nitride semiconductor layer 14 by an area larger than the area of the n-side electrode 16. To this end, the light emitting area is decreased and the light emitting efficiency according to a ratio of brightness to device size is deteriorated.

To improve the aforementioned drawbacks of the horizontal structure nitride semiconductor LED, development of a vertical structure nitride semiconductor LED is actively performed, in which the sapphire substrate is removed using a laser lift-off process.

FIG. 1B is a perspective view of a vertical structure nitride semiconductor LED according to the related art. Referring to FIG. 1B, the related art vertical structure nitride semiconductor LED includes an n-type nitride semiconductor layer 12, an active layer 13, a p-type nitride semiconductor layer 14, a high reflective ohmic contact layer 15 and a conductive support substrate 18. To form the above vertical structure nitride semiconductor LED, the n-type nitride semiconductor layer 12, the active layer 13, and the p-type nitride semiconductor layer 14 are sequentially formed on a sapphire substrate and thereafter the sapphire substrate is removed using a laser lift off (LLO) process. At this time, the n-type nitride semiconductor layer 12 serves as the uppermost layer and an upper surface of the n-type nitride semiconductor layer 12 is used as a light emitting surface. A transparent electrode layer 19 for improving the current diffusion can be optionally formed on the upper surface of the n-type nitride semiconductor layer 12. Also, an n-side electrode 16 is formed on the upper surface of the n-type nitride semiconductor layer 12 or an upper surface of the transparent electrode layer 19, and is supplied with current through a wire bonded thereto.

Such vertical structure nitride semiconductor LEDs have generally a rectangular cross section. To this end, when light generated from the active layer 13 travels toward a side surface of the LED, a difference in refractive index between the nitride constituting the LED and outer air restricts an incident angle allowing light to emit outside the LED. As shown in FIG. 2, the light generated at a point of the active layer 13 of the LED can pass through the side surface of the LED and emit to an outside only when it travels at an angle smaller than an incident angle θ. The light traveling at an angle larger than the incident angle is totally reflected toward an inside of the LED. Since the totally reflected light cannot emit from the inside of the LED to the outside, the light extraction efficiency of the LED is deteriorated, so that brightness decreases. In addition, since the light that does not emit to the outside of the LED is dissipated as heat inside the LED to increase the exothermic amount of the LED, the inner temperature is elevated to change the characteristic of the LED and to shorten the lift span.

SUMMARY OF THE INVENTION

Accordingly, the present invention is directed to a method of fabricating a vertical structure nitride semiconductor light emitting device that substantially obviates one or more problems due to limitations and disadvantages of the related art.

An object of the present invention is to provide a method of fabricating a vertical structure nitride semiconductor light emitting device that can allow the vertical structure nitride semiconductor light emitting device to be fabricated with a polygonal cross section having five or more sides, thereby enhancing the light extraction efficiency through a side surface of the vertical structure nitride semiconductor light emitting device, to prevent the device characteristic from being deteriorated due to heat generation and to extend the lift span.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method of fabricating a vertical structure nitride semiconductor light emitting device, the method including: forming a light emitting structure including an n-type nitride semiconductor layer, an active layer and a p-type nitride semiconductor layer sequentially disposed on a sapphire substrate; forming a metal layer having a plurality of patterns on the light emitting structure, the plurality of patterns of the metal layer each having a shape corresponding to a cross-sectional shape of a wanted final light emitting device and being spaced apart by a predetermined distance such that an upper surface of the light emitting structure is partially exposed; dividing the light emitting structure into a plurality of individualized light emitting structures each having a size corresponding to a size of the final light emitting device by removing the light emitting structure below the exposed region between the plurality of patterns of the metal layer; separating the sapphire substrate from the light emitting structure by irradiating a laser beam onto a lower surface of the sapphire substrate, whereby the light emitting structure is completely separated in the size corresponding to the size of the final light emitting device; and forming a bonding pad on a surface of the n-type nitride semiconductor layer from which the sapphire substrate is removed.

The forming of the metal layer having the plurality of patterns, may include: forming a mask pattern which exposes predetermined regions of an upper surface of the light emitting structure on which the plurality of patterns of the metal layer are formed, but covers remaining regions other than the predetermined regions of the upper surface of the light emitting structure; forming a metal layer on the exposed regions of the upper surface of the light emitting structure using a plating method; and removing the mask pattern.

The plurality of patterns of the metal layer may have a polygonal cross section having five or more sides or a circular cross section.

The separating of the light emitting structure may include removing the light emitting structure corresponding to the exposed regions between the pluralities of patterns of the metal layer using a dry etching method.

The separating of the sapphire substrate may include irradiating the laser beam at least two times onto the lower surface of the sapphire substrate located below the individualized light emitting structures divided in the size of the final light emitting device.

The forming of the light emitting structure may further include forming a high reflective ohmic contact layer having a conductivity and a reflectivity on the p-type nitride semiconductor layer. The high reflective ohmic contact layer may include at least one layer made of one selected from the group consisting of Ag, Ni, Al, Rh, Pd, Ir, Ru, Hg, Zn, Pt, Au, Hf and a combination thereof.

The forming of the bonding pad may include: forming a transparent electrode layer on a surface of the n-type nitride semiconductor layer from which the sapphire substrate is removed; and forming the bonding pad on a lower surface of the transparent electrode layer. The transparent electrode layer may be formed in at least one layer of one selected from Indium tin oxide (ITO), indium oxide (IO), Tin dioxide ($SnO_2$) and indium zinc oxide (IZO).

According to another aspect of the present invention, there is provided a method of fabricating a vertical structure nitride semiconductor light emitting device, the method including: forming a light emitting structure including an n-type nitride semiconductor layer, an active layer and a p-type nitride semiconductor layer sequentially disposed on a sapphire substrate; dividing the light emitting structure into a plurality of individualized light emitting structures each having a cross section and a size of a wanted final light emitting device by partially removing the light emitting structure; forming a metal layer on upper surfaces of the individualized light emitting structures; separating the sapphire substrate from the individualized light emitting structures by irradiating a laser beam onto a lower surface of the sapphire substrate, whereby the individualized light emitting structures are completely separated in the size of the final light emitting device; and forming a bonding pad on a surface of the n-type nitride semiconductor layer from which the sapphire substrate is removed.

The separating of the light emitting device into the plurality of individualized light emitting devices, may include: forming a mask pattern which exposes predetermined regions of an upper surface of the light emitting structure corresponding to upper surfaces of the plurality of individualized light emitting structures, but covers remaining regions other than the predetermined regions of the upper surface of the light emitting structure; and removing the exposed regions of the upper surface of the light emitting device using a dry etch method.

The final light emitting device may have a polygonal cross section having five or more sides or a circular cross section.

The forming of the metal layer may include: forming a mask pattern higher than the individualized light emitting structures between the plurality of individualized light emitting structures; forming a metal layer on the individualized light emitting structures using a plating method; and removing the mask pattern.

The separating of the sapphire substrate may include irradiating the laser beam at least two times onto the lower surface of the sapphire substrate located below the individualized light emitting structures.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
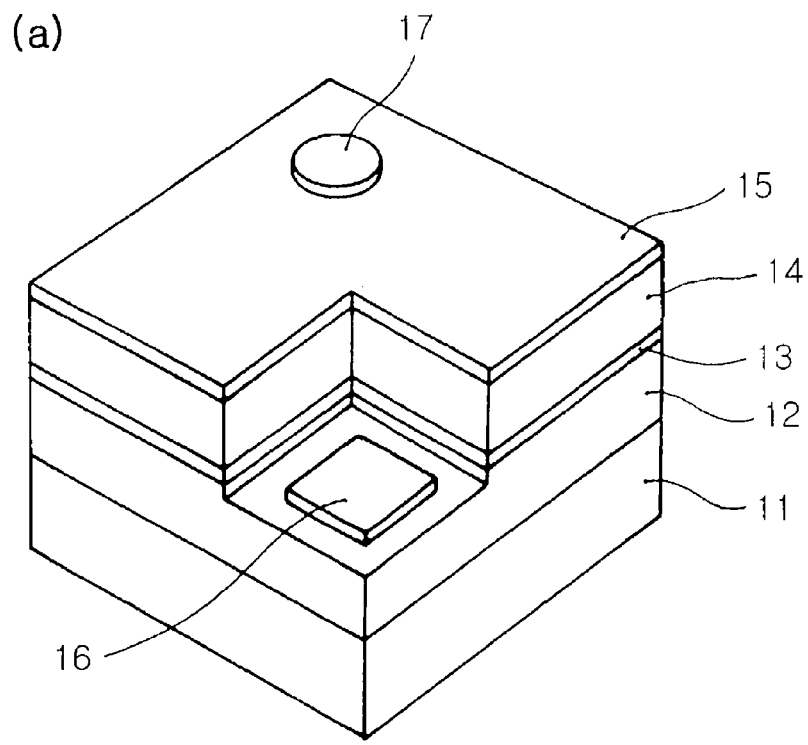
FIGS. 1A and 1B are perspective views of nitride semiconductor light emitting devices according to the related art.
Figure 1:
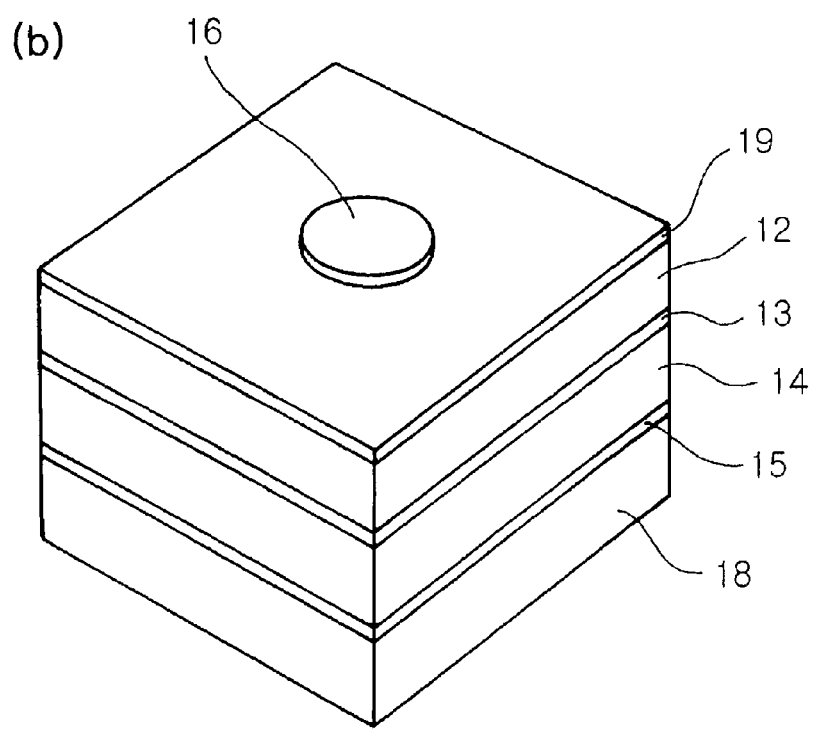
Figure 2:
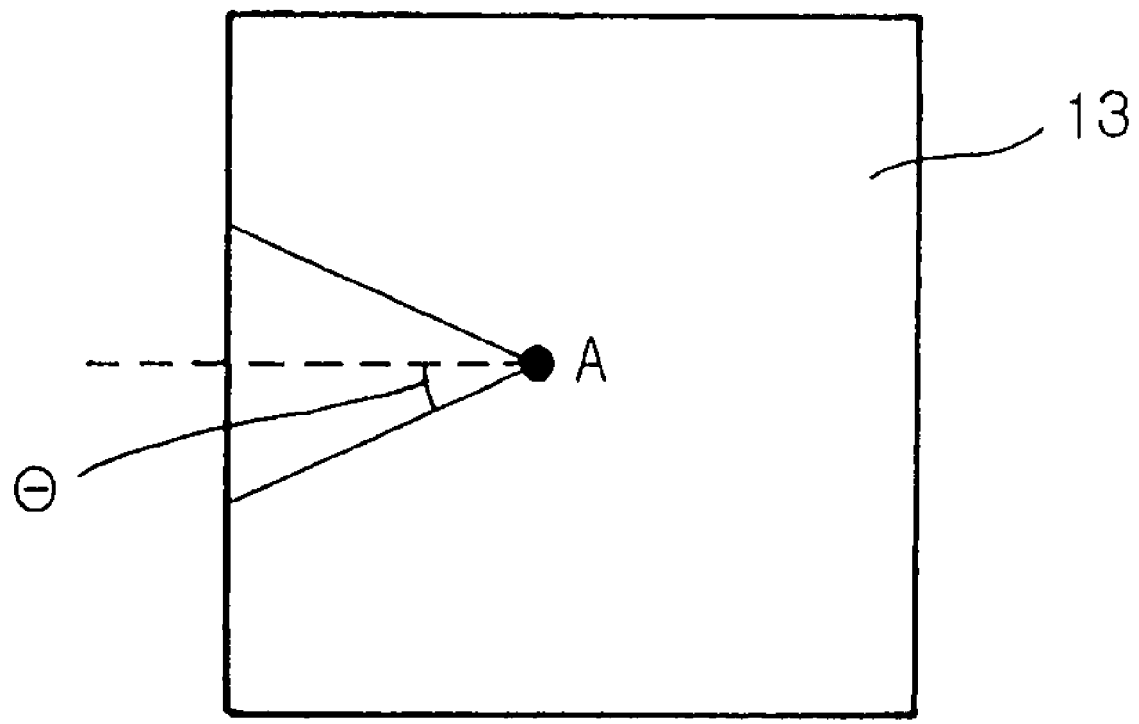
FIG. 2 is a concept view explaining a problem caused in the related art nitride semiconductor light emitting device.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

FIGS. 3a through 3d are sectional views illustrating a method of fabricating a vertical structure nitride semiconductor light emitting device according to an embodiment of the present invention.

Referring to FIG. 3a, an n-type nitride semiconductor layer 112, an active layer 113, a p-type nitride semiconductor layer 114 and a high reflective ohmic contact layer 115 are sequentially stacked on a sapphire substrate 111 to form a light emitting structure. In the layer layout of the light emitting structure, the high reflective ohmic contact layer 115 may be omitted if necessary. Accordingly, the term 'light emitting structure' in the present invention is defined as a structure including the n-type nitride semiconductor layer 112, the active layer 113 and the p-type nitride semiconductor layer 114 sequentially formed on the sapphire substrate 111 or as a structure including the n-type nitride semiconductor layer 112, the active layer 113, the p-type nitride semiconductor layer 114 and the high reflective ohmic contact layer 115 sequentially formed on the sapphire substrate 111.

The sapphire substrate 111 is a crystal having a hexa-Rhombo R3c type symmetry and is characterized by a lattice constant of 13.001 Å in a c-axis direction, a distance between lattices of 4.765 Å in an a-axis direction, and orientation planes C(0001), A(1120), R(1102) and the like. Since C-plane of the sapphire substrate (111) allows a thin nitride film to be easily grown thereon and is stable in high temperature, the sapphire substrate is mainly used as a substrate for an optical device.

The n-type nitride semiconductor layer 112 can be made of n-doped semiconductor material having a composition formula of $Al_xIn_yGa_{(1-x-y)}N$ (where $0 \leq x \leq 1$, $0 \leq y \leq 1$, $0 \leq x+y \leq 1$). Representative materials of the nitride semiconductor layer include GaN, AlGaN and GaInN. For doping of the n-type nitride semiconductor layer 112, impurities, such as Si, Ge, Se, Te, C or the like can be used. The n-type nitride semiconductor layer 112 is formed by depositing the above semiconductor material on the sapphire substrate using a well-known deposition process, such as a metal organic chemical vapor deposition (MOCVD), a molecular beam epitaxy (MBE) or a hybride vapor phase epitaxy (HVPE).

Normally, a buffer layer for buffering the lattice mismatching may be formed between the sapphire substrate 111 and the n-type nitride semiconductor layer 112. As the buffer layer, a low temperature nucleus growth layer, such as GaN, AlN or the like and/or non-doped nitride layer can be used.

The active layer 113 is a layer for emitting light, and is made of a nitride semiconductor layer, such as GaN, InGaN or the like having a single quantum well structure or a multi-quantum well structure. The active layer 113 can be formed using a well-known deposition process, such as an MOCVD, an MBE or an HVPE, like the n-type nitride semiconductor layer 112.

Like the n-type nitride semiconductor layer 112, the p-type nitride semiconductor layer 114 can be made of p-doped semiconductor material having a composition formula of $Al_xIn_yGa_{(1-x-y)}N$ (where $0 \leq x \leq 1$, $0 \leq y \leq 1$, $0 \leq x+y \leq 1$). Representative materials of the nitride semiconductor layer include GaN, AlGaN and GaInN. For doping of the p-type nitride semiconductor layer 112, impurities, such as Mg, Zn, Be or the like can be used. The p-type nitride semiconductor layer 114 is formed by depositing the above semiconductor material on the sapphire substrate using a well-known deposition process, such as a metal organic chemical vapor deposition (MOCVD), a molecular beam epitaxy (HBE) or a hybride vapor phase epitaxy (HVPE).

The high reflective ohmic contact layer 115 is suitable for lowering the contact resistance with the p-type nitride semiconductor layer 114 having a relatively high energy bandgap, and at the same time for enhancing the effective brightness of the light directing toward a lower surface of the n-type nitride semiconductor layer 112 serving as a light emitting surface. The high reflective ohmic contact layer 115 can be made of a metal having a high reflectivity. It is preferable that the high reflective ohmic contact layer 115 be formed in a structure including at least one layer made of one selected from the group consisting of Ag, Ni, Al, Rh, Pd, Ir, Ru, Mg, Zn, Pt, Au, Hf and a combination thereof.

Next, at least two metal layers are formed on the light emitting structure, which is shown in FIGS. 3B and 3C.

At least two metal layers 131 formed on an upper surface of the light emitting structure are an element included in a finally fabricated light emitting device, and have the same cross section as that of the finally fabricated light emitting device. The metal layers 131 are formed on the upper surface of the light emitting structure such that they are spaced apart by a predetermined interval from each other and the upper surface of the light emitting structure is partially exposed. Each of the metal layers 131 serves as a p-side electrode of individualized light emitting structures as fabricated and at the same time as a support body supporting the light emitting structure. Accordingly, the cross section of each of the metal layers 131 is the same in shape as that of each of the individualized light emitting structures as finally fabricated.

Figure 5:
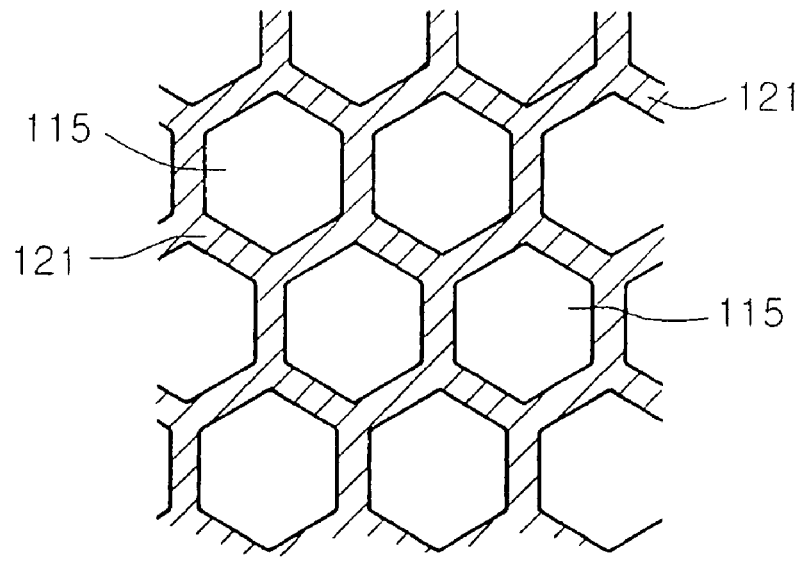
FIGS. 5a and 5b are plane views of exemplary mask patterns formed on a light emitting structure in order to form a metal layer of the present invention.
Figure 5:
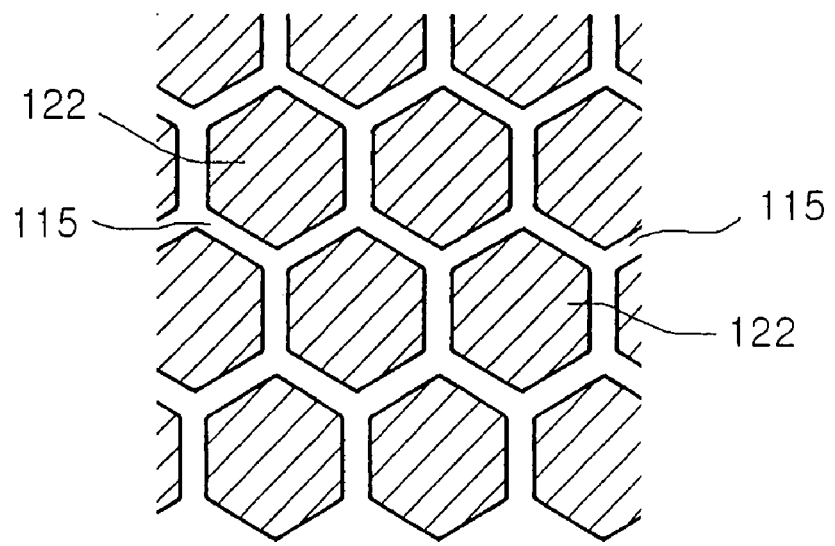

Hereinafter, process steps of forming the at least two metal layers 131 will be describe in more detail. As shown in FIG. 3B, a mask pattern 121 is formed on the upper surface 115 of the light emitting structure. The mask pattern 121 exposes predetermined regions of the upper surface of the light emitting structure on which the at least two metal layers are being formed, but covers the remaining regions. The mask pattern 121 is shown in FIG. 5a in detail. Referring to FIG. 5A, the mask pattern which exposes predetermined regions of the upper surface of the light emitting structure on which the at least two metal layers are being formed, but covers the remaining regions, is formed. Accordingly, during a subsequent process of forming the metal layers, the metal layers patterns are formed on the exposed regions of the light emitting structure and are spaced apart by a predetermined interval from each other.

The present invention is characterized by providing a method of fabricating a vertical structure nitride semiconductor light emitting device having a polygonal cross section having five or more sides, or a circular cross section. For this purpose, it is required that the metal layers have the same cross section in shape as that of the finally fabricated light emitting device, for example, a pentagon, a polygon having more sides than the pentagon, or a circle. Accordingly, the mask pattern 121 should be patterned such that the exposed portions of the upper surface of the light emitting structure have the same cross section in shape as those of the metal layers.

Next, referring to FIG. 3C, the metal layers 131 are formed on the upper surface of the light emitting structure exposed due to the mask pattern 121 by a plating method, and then the mask pattern 121 (see 121 of FIG. 3B) is removed. The plating method used for forming the metal layers 131 includes well-known methods, such as an electrolyte plating, a non-electrolyte plating, a deposition plating and the like. Out of the aforementioned plating methods, one having the shortest plating time is preferably selected.

Figure 3:
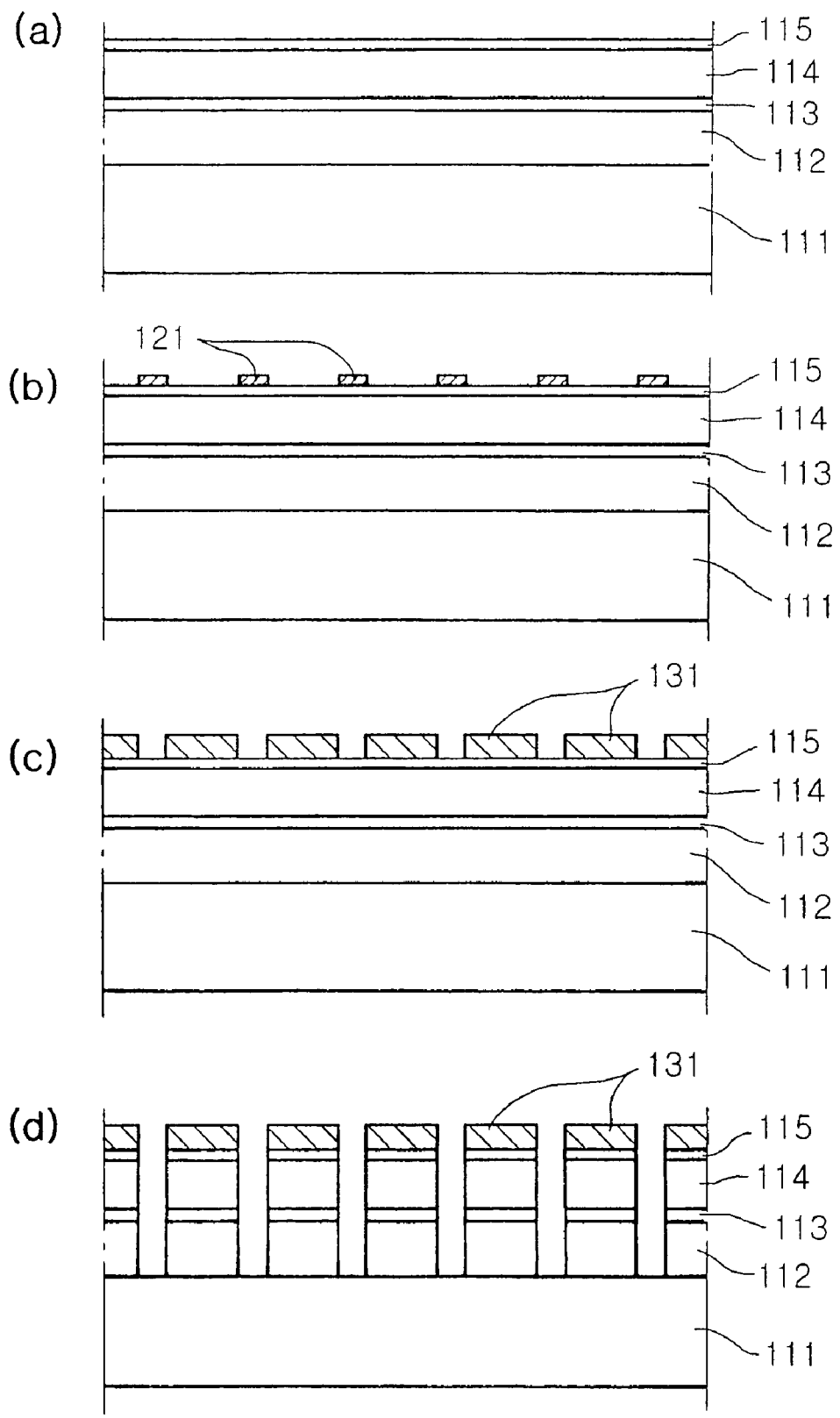
FIGS. 3a through 3d are sectional views illustrating a method of fabricating a vertical structure nitride semiconductor light emitting device according to an embodiment of the present invention.

Next, referring to FIG. 3D, regions between patterns of the metal layers 131 are removed such that the resultant light emitting structure of FIG. 3 is divided into individual light emitting devices each having a final size. The nitride semiconductor material constituting the light emitting structure can be easily processed by a dry etching so as to have a wanted cross-sectional shape. The dry etch can be performed by a reactive ion etching (RIE) method or the like well known in this art. In this dry etching process, since the metal layers 131 are used as an etch mask, a process of forming a separate mask can be omitted. Through the dry etching process, the light emitting structure of FIG. 3C are divided into the finally individualized light emitting structures each having the same cross-sectional shape (ex. pentagon, polygon having more sides than pentagon or circle) as that of the metal layer 131.

Figure 6:
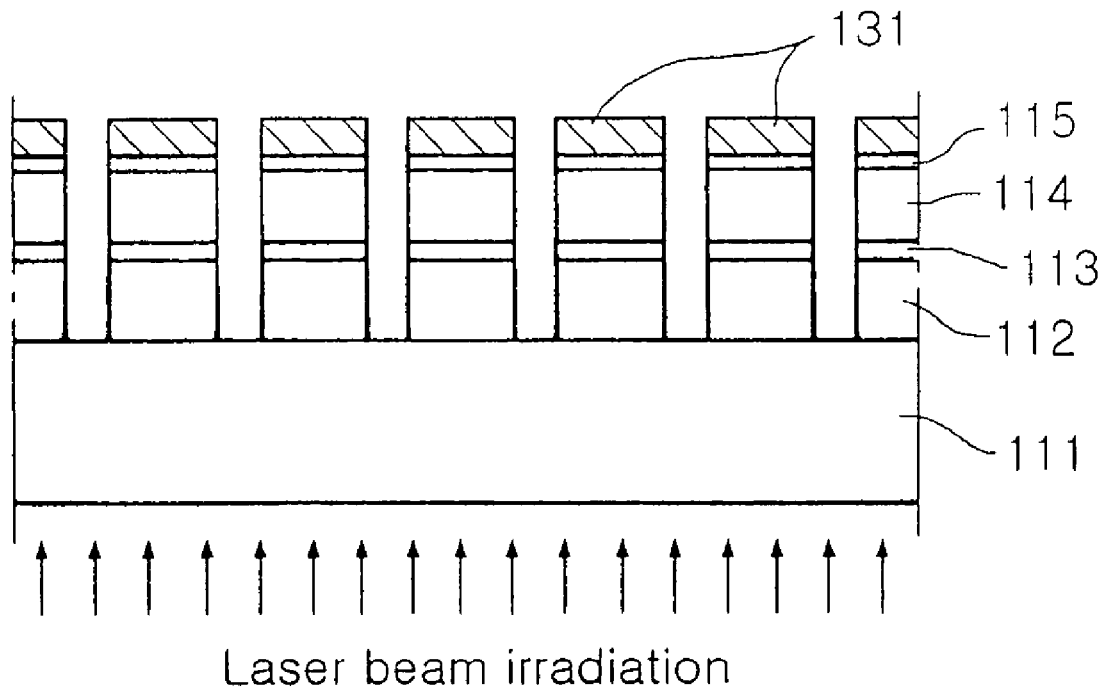
FIGS. 6a and 6b are sectional views illustrating process steps following the process steps of FIGS. 3 and 4.
Figure 6:
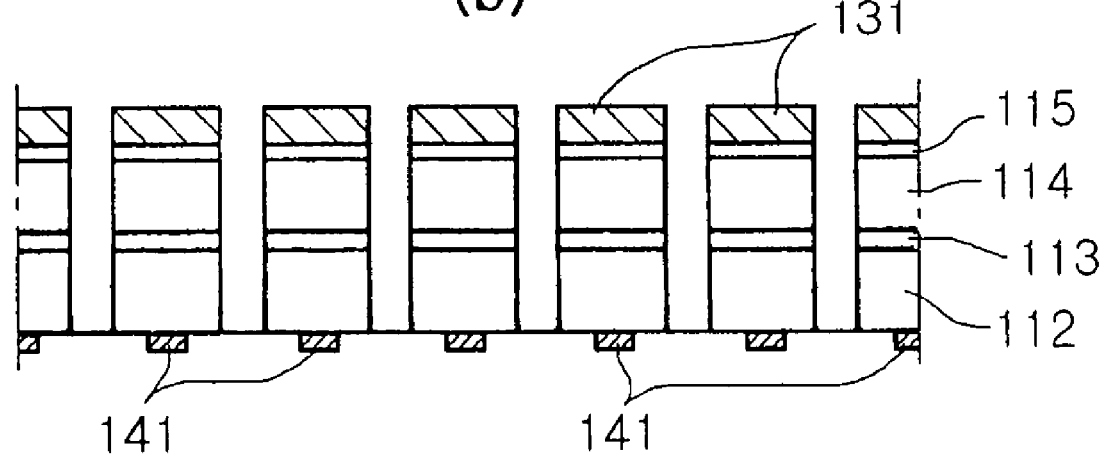

Subsequent process steps are shown in FIGS. 6A and 6B.

Figure 7:
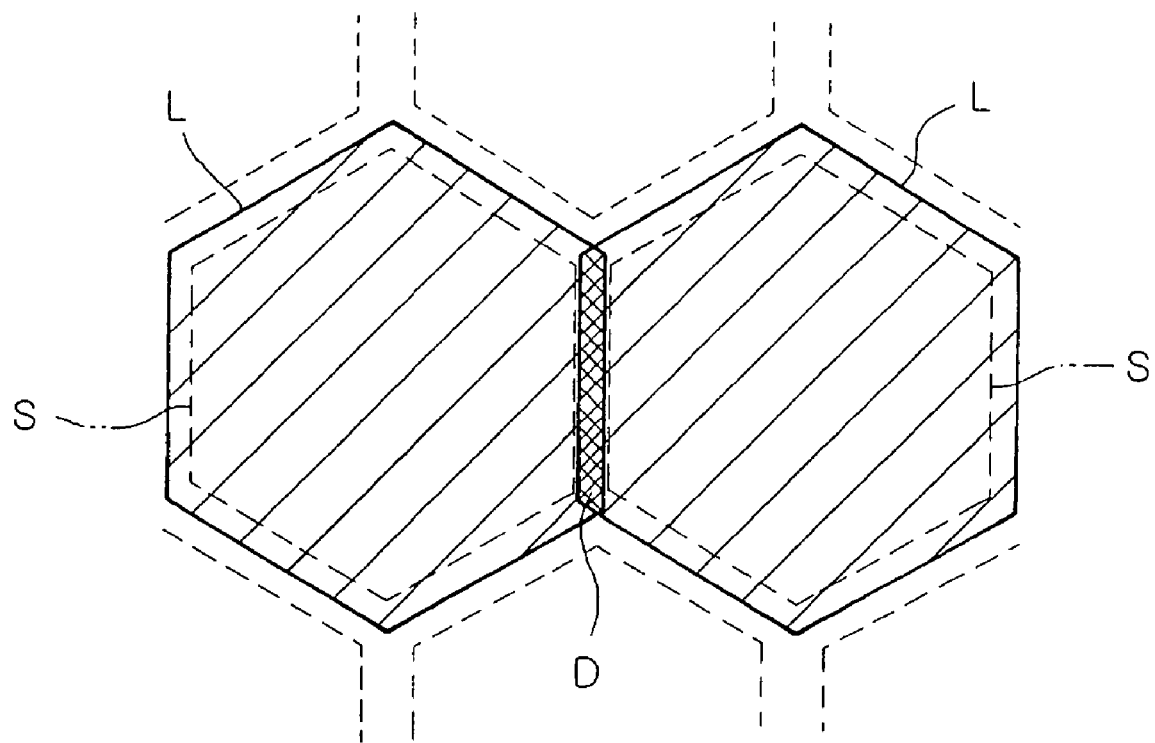
FIG. 7 is a concept view explaining a laser beam irradiation region according to the present invention.

Referring to FIG. 6A, a laser beam is irradiated onto a lower surface of the sapphire substrate 111 to separate the sapphire substrate from the light emitting structure. Herein, it is preferable that the laser beam should not be irradiated onto the entire surface of the sapphire substrate 111 but be irradiated two or more times aligning with the respective divided light emitting devices formed on the sapphire substrate 111, which will be described in more detail with reference to FIG. 7. FIG. 7 shows the lower surface of the sapphire substrate so as to explain a laser beam irradiation region. As shown in FIG. 7, the light emitting structures 'S' divided in a size of an individual light emitting device on the sapphire substrate 111 are spaced apart by a predetermined interval from one another, and the laser beam irradiation region 'L' includes a region corresponding to the lower surface of each of the divided light emitting structures. At this time, it is preferable that the laser beam irradiation region 'L' should not include a lower region of an adjacent light emitting structure 'S'. If the laser beam irradiation region extends to the adjacent lower region, a laser beam overlapping zone 'D' may be generated. The laser beams overlapping each other may damage the overlying light emitting structures. Accordingly, it is required that the laser beam irradiation region should include the lower region 'S' of each of the light emitting devices but should not extend to the adjacent lower region of an adjacent light emitting structure, and the laser beam overlapping region 'D' should be a region spaced between adjacent light emitting devices.

As aforementioned, since the vertical structure light emitting device has a polygonal cross section having five or more sides or a circular cross section, it is preferable that the irradiated laser beam should have the same shape as that of the cross section of the wanted light emitting device. For this purpose, it is preferable that a laser mask using a metal material be disposed between the irradiated laser beam and the sapphire substrate. In other words, the laser mask can be fabricated in a form passing through the cross section of the wanted light emitting device. Preferably, the laser mask can be fabricated in a wanted form using a plurality of iris wings like an iris of a camera, or using a mask including a quartz plate and a metal pattern formed thereon like in a photolithography process.

Next, referring to FIG. 6B, bonding pads 141 are formed on a lower surface of the n-type nitride semiconductor layer 112 from which the sapphire substrate is removed. The bonding pads 141 serve as an n-side electrode of the light emitting device. The bonding pads 141 can be formed by a process including forming a transparent electrode (not shown) on the lower surface of the n-type nitride semiconductor layer 112 from which the sapphire substrate 111 is removed, and forming the bonding pads 141 on a lower surface of the transparent electrode layer. In the vertical structure nitride semiconductor light emitting device, the lower surface of the n-type nitride semiconductor layer 112 from which the sapphire substrate 111 is removed becomes a light emitting surface. Accordingly, in order to improve a diffusion of current supplied from the n-side electrode and at the same time to prevent emitting light from being lost, it is preferable that the transparent electrode layer be formed on the lower surface of the n-type nitride semiconductor layer 112 from which the sapphire substrate 111 is removed. The transparent electrode layer can be formed one selected from Indium tin oxide (ITO), indium oxide (IO), Tin dioxide ($SnO_2$) and indium zinc oxide (IZO).

A method of fabricating a vertical structure nitride semiconductor light emitting device according to a second embodiment of the present invention will be described with reference to FIGS. 4A to 4E.

Figure 4:
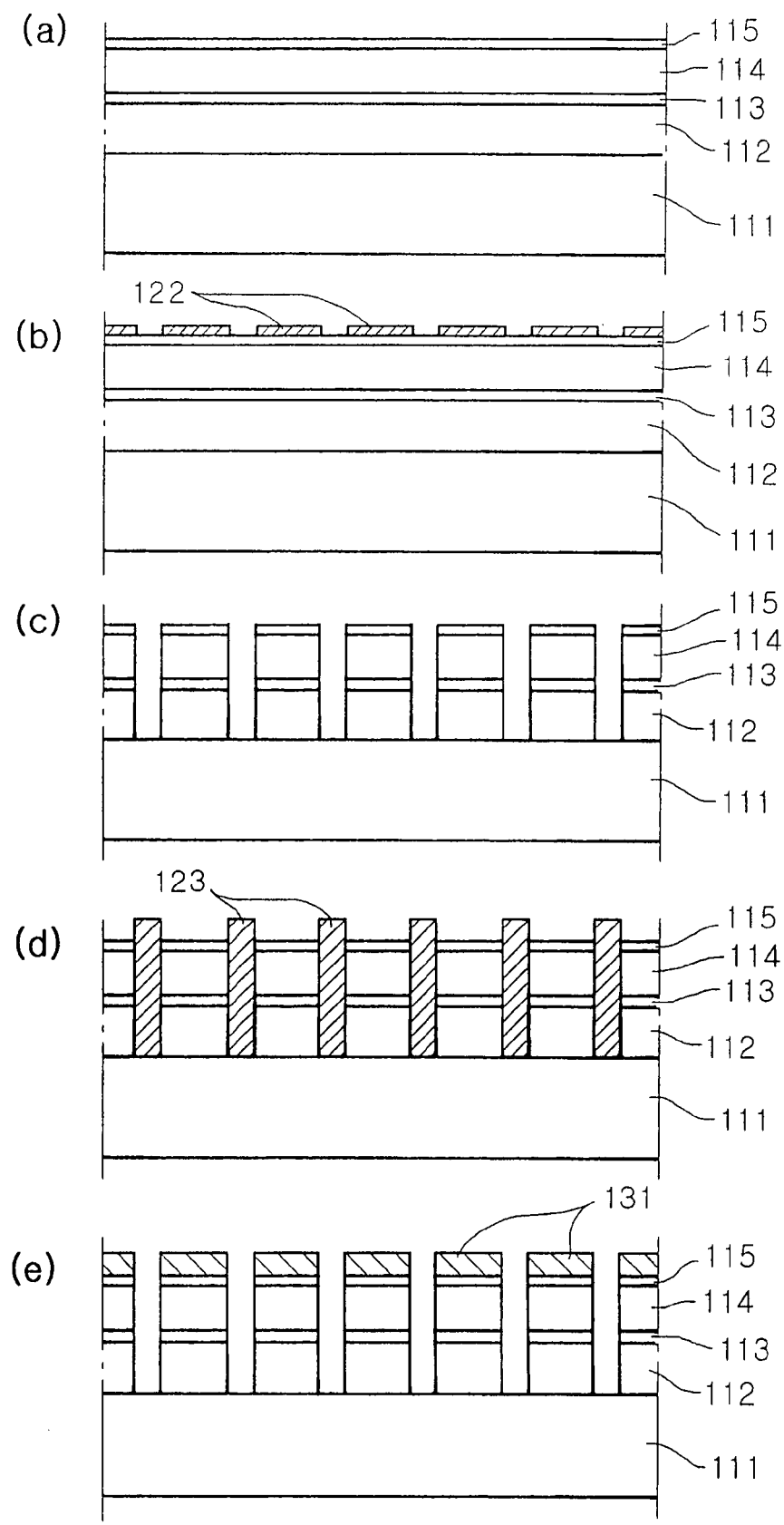
FIGS. 4a through 4e are sectional views illustrating a method of fabricating a vertical structure nitride semiconductor light emitting device according to an embodiment of the present invention.

First, referring to FIG. 4A, an n-type nitride semiconductor layer 112, an active layer 113, and a p-type nitride semiconductor layer 114 are sequentially stacked on a sapphire substrate 111 to form a light emitting structure. Like in the aforementioned first embodiment of the present invention, a high reflective ohmic contact layer 115 can be further formed on the p-type nitride semiconductor layer 114. Descriptions concerning the high reflective ohmic contact layer 115 will be omitted so as to avoid the repetition with those performed in the first embodiment.

Next, referring to FIGS. 4B and 4C, the light emitting structure is partially removed such that the resultant light emitting structure of FIG. 4B is divided into individual light emitting devices each having the same cross section and size as those of a wanted final light emitting device. The dividing of the light emitting structure into a plurality of light emitting devices can be performed by forming a mask pattern 122 covering regions corresponding to the respective upper surfaces of the plurality of individualized light emitting structures and exposes the remaining regions on an upper surface of the light emitting structure as shown in FIG. 4B and removing the exposed regions of the light emitting structure by a dry etching method using the mask pattern 122 as an etch mask, as shown in FIG. 4C. FIG. 5B shows a shape of the mask pattern 122. As shown in FIG. 5B, the mask pattern 122 is formed in a pattern which covers upper regions of the light emitting structure on which a metal layer having a plurality of pattern is being formed but exposes the remaining regions. Accordingly, the exposed regions are removed by the dry etching, so that the light emitting structure is divided into the plurality of individualized light emitting structures each having the cross section and size of a finally fabricated light emitting device. Each of the regions covered by the mask pattern 122 has the same cross-sectional shape as that of each of the plurality of individualized light emitting structures. FIG. 5B exemplarily shows a hexagonal cross section, but the present invention is not limited thereto.

Next, referring to FIGS. 4D and 4E, a metal layer 131 is formed on the upper surfaces of the plurality of individualized light emitting structures. As shown in FIG. 4D, the metal layer 131 is formed by forming a mask pattern 123 made higher than the plurality of individualized light emitting structures between the plurality of individualized light emitting structures, forming a metal layer 131 on the upper surfaces of the plurality of individualized light emitting structures using a plating method, and removing the mask pattern 123. The plating method used for forming the metal layers 131 includes well-known methods, such as an electrolyte plating, a non-electrolyte plating, a deposition plating and the like. Out of the aforementioned plating methods, one having the shortest plating time is preferably selected.

Compared with the first embodiment, the second embodiment further includes one process of forming the mask pattern. In terms of the simplification of the process, the first embodiment is more preferable than the second embodiment.

Subsequent process steps are shown in FIGS. 6A and 6B. Since the process steps shown in FIGS. 6A and 6B are the same as those described in the first embodiment, they will be omitted.

According to a method of fabricating a vertical structure nitride semiconductor light emitting device provided in the present invention, since the vertical structure nitride semiconductor light emitting device can be formed with a cross-sectional shape of a polygon having five or more sides, or a circle, the amount of light emitting through a side surface of the light emitting device to improve the light extraction efficiency, and thereby the amount of light dissipated as heat inside the light emitting device is decreased to decrease the heat generated from the light emitting device.

As described above, according to the present invention, since the vertical structure nitride semiconductor light emitting device can be formed with a cross-sectional shape of a polygon having five or more sides, or a circle, the amount of light emitting through a side surface of the light emitting device to improve the light extraction efficiency, and thereby the amount of light dissipated as heat inside the light emitting device is decreased to decrease the heat generated from the light emitting device. As a result, it is possible to increase the brightness of the light emitting from the light emitting device. In addition, inner heat generation is decreased to increase the life span of the light emitting device and the properties of the light emitting device can be prevented from being deteriorated due to the heat generation.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a vertical structure nitride semiconductor light emitting device, the method comprising:
    forming a light emitting structure including an n-type nitride semiconductor layer, an active layer and a p-type nitride semiconductor layer sequentially disposed on a sapphire substrate;
    dividing the light emitting structure into a plurality of individualized light emitting structures each having a cross section and a size of a wanted final light emitting device by partially removing the light emitting structure;
    forming metal layers respectively on upper surfaces of the individualized light emitting structures;
    separating the sapphire substrate from the individual light emitting structures by irradiating a laser beam onto a lower surface of the sapphire substrate, whereby the individualized light emitting structures are completely separated in the size of the final light emitting device; and
    forming a bonding pad on a surface of the n-type nitride semiconductor layer from which the sapphire substrate is removed,
    wherein
    the step of forming metal layers comprises:
        forming a mask pattern higher than the individual light emitting structures between the plurality of individualized light emitting structures;
        forming the metal layers on the individualized light emitting structures so that the metal layer has a shape identical to that of the upper surface of the individual light emitting structure by using the mask pattern; and
        removing the mask pattern.

2. The method of claim 1, wherein the step of dividing the light emitting structure into the plurality of individualized light emitting structures comprises:
    forming a mask pattern which exposes predetermined regions of an upper surface of the light emitting structure corresponding to upper surfaces of the plurality of individualized light emitting structures, but covers remaining regions other than the predetermined regions of the upper surface of the light emitting structure; and
    removing the exposed regions of the upper surface of the light emitting device using a dry etch method.

3. The method of claim 1, wherein the final light emitting device has a polygonal cross section having five or more sides.

4. The method of claim 1, wherein the separating of the sapphire substrate comprises irradiating the laser beam at least two times onto the lower surface of the sapphire substrate located below the individualized light emitting structures.

5. The method of claim 1, wherein the forming of the light emitting structure further comprises forming a high reflective ohmic contact layer having a conductivity and a reflectivity on the p-type nitride semiconductor layer.

6. The method of claim 5, wherein the high reflective ohmic contact layer comprises at least one layer made of one selected from the group consisting of Ag, Ni, Al, Rh, Pd, Ir, Ru, Mg, Zn, Pt, Au, Hf and a combination thereof.

7. The method of claim 1, wherein the forming of the bonding pad comprises:
    forming a transparent electrode layer on a surface of the n-type nitride semiconductor layer from which the sapphire substrate is removed; and
    forming the bonding pad on a lower surface of the transparent electrode layer.

8. The method of claim 7, wherein the transparent electrode layer is formed in at least one layer of one selected from Indium tin oxide (ITO), indium oxide (IO), Tin dioxide ($SnO_2$) and indium zinc oxide (IZO).

9. The method of claim 1, wherein the final light emitting device has a circular cross section.

* * * * *